United States Patent [19]

Colak

[11] Patent Number: 4,626,879

[45] Date of Patent: Dec. 2, 1986

[54] LATERAL DOUBLE-DIFFUSED MOS TRANSISTOR DEVICES SUITABLE FOR SOURCE-FOLLOWER APPLICATIONS

[75] Inventor: Sel Colak, Ossining, N.Y.

[73] Assignee: North American Philips Corporation, New York, N.Y.

[21] Appl. No.: 766,665

[22] Filed: Aug. 15, 1985

Related U.S. Application Data

[63] Continuation of Ser. No. 451,993, Dec. 21, 1982, abandoned.

[51] Int. Cl.[4] ............................................. H01L 29/94
[52] U.S. Cl. .................................. 357/23.4; 357/23.8; 357/23.14; 357/13
[58] Field of Search .............................. 357/23.4, 23.8

[56] References Cited

U.S. PATENT DOCUMENTS

| | | | |
|---|---|---|---|
| 4,292,642 | 9/1981 | Appels et al. | 357/13 |
| 4,300,150 | 11/1981 | Colak | 357/13 |
| 4,422,089 | 12/1983 | Vaes et al. | 357/23.4 |

OTHER PUBLICATIONS

Pocha et al, "Tradeoff Between Threshold Voltage and Breakdown in High Voltage Double-Diffused MOS Transistors", *IEEE Trans. on Elec. Dev.*, vol. ED25, No. 11, Nov. 1978.

Colak et al., "Lateral DMOS Power Transistor Design", *IEEE Electron Device Letters*, vol. EDL-1, No. 4, Apr. 80.

*Primary Examiner*—Martin H. Edlow
*Assistant Examiner*—Charles S. Small, Jr.
*Attorney, Agent, or Firm*—Robert T. Mayer; Steven R. Biren

[57] ABSTRACT

A lateral double-diffused MOS transistor includes an intermediate semiconductor layer of the same conductivity type as the channel region which extends laterally from the channel region to beneath the drain contact region of the device. This intermediate semiconductor layer substantially improves the punchthrough and avalanche breakdown characteristics of the device, thus permitting operation in the source-follower mode, while also providing a compact structure which features a relatively low normalized "on" resistance.

12 Claims, 5 Drawing Figures

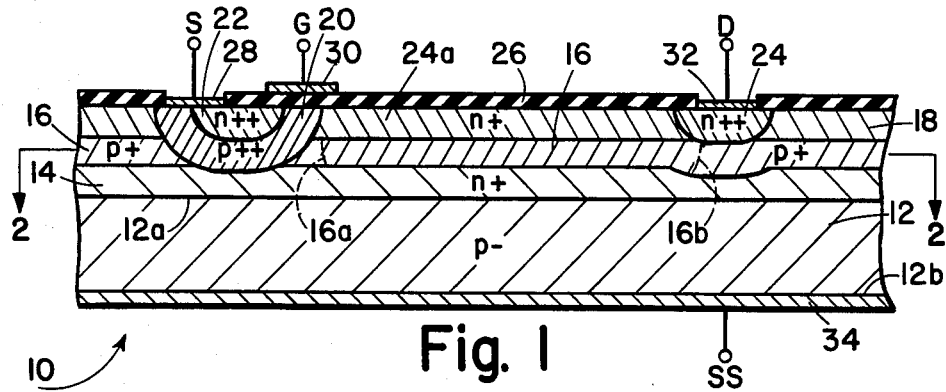

LATERAL DOUBLE-DIFFUSED MOS TRANSISTOR DEVICES SUITABLE FOR SOURCE-FOLLOWER APPLICATIONS

This is a continuation of application Ser. No. 451,993, filed Dec. 21, 1982, now abandoned.

BACKGROUND OF THE INVENTION

The invention is in the field of metal-oxide-semiconductor (MOS) field-effect devices, and relates specifically to lateral double-diffused MOS (DMOS) field-effect transistors suitable for use in source-follower applications.

A typical prior-art high voltage DMOS transistor is shown on page 1325 of the "IEEE Transactions on Electron Devices", Vol. ED-25, No. 11, November 1978, in a paper entitled "Tradeoff Between Threshold Voltage and Breakdown in High-Voltage Double-Diffused MOS Transistors", by Pocha et al. This device includes a semiconductor substrate of a first conductivity type (p-type), a surface layer of a second conductivity type (n-type) on the substrate, a surface-adjoining channel region of the first conductivity type in the epitaxial layer, a surface-adjoining source region of the second conductivity type in the channel region, and a surface-adjoining drain contact region of the second conductivity type in the epitaxial layer and spaced apart from the channel region. An insulating layer is provided on the surface layer and covers at least that portion of the channel region located between the source and drain. A gate electrode is provided on the insulating layer, over a portion of the channel region between the source and drain and is electrically isolated from the surface layer, while source and drain electrodes are connected respectively to the source and drain regions of the transistor. Such prior-art high-voltage DMOS transistors have a relatively thick surface layer (typically an epitaxial layer), in the order of about 25–30 microns for a breakdown voltage of about 250 V, as indicated in the Pocha et al paper. Furthermore, the punchthrough and avalanche breakdown characteristics of these devices relative to their epitaxial layer thickness make them unsuitable for efficient use in applications requiring high voltages.

It has been found that the breakdown characteristics of high-voltage semiconductor devices can be improved using the REduced SURface Field (or RESURF) technique, as described in "High Voltage Thin Layer Devices (RESURF Devices)", "International Electronic Devices Meeting Technical Digest", December 1979, pages 238–240, by Appels et al, and U.S. Pat. No. 4,292,642 to Appels et al. Essentially, the improved breakdown characteristics of these RESURF devices are achieved by employing thinner but more highly doped epitaxial layers to reduce surface fields. As defined in my U.S. Pat. No. 4,300,150, the RESURF principle requires that appropriate values for the product of layer thickness and resistivity be selected. More particularly, the product of doping concentration and layer thickness for RESURF is defined in my prior patent as typically approximately $10^{12}$ atoms/cm$^2$, with a representative value of $1.8(10)^{12}$ atoms/cm$^2$ shown in the examples.

The RESURF technique was applied to lateral double-diffused MOS transistors, as reported in "Lateral DMOS Power Transistor Design", "IEEE Electron Device Letters", Vol. EDL-1, pages 51–53, April, 1980, by Colak et al and my U.S. Pat. No. 4,300,150, and the result was a substantial improvement in device characteristics. It should be understood that in high-voltage DMOS devices, there is always a trade-off between breakdown voltage, on-resistance and device size, with the goal being to increase the breakdown voltage level while maintaining a relatively low on-resistance in a relatively compact device. Using the prior art RESURF technique, and for reference assuming a constant breakdown voltage of about 400 volts, a very substantial improvement (e.g. decrease) in on-resistance may be obtained in a device of the same size as a conventional (thick epitaxial layer) DMOS device.

However, such prior art RESURF devices, with their thin epitaxial layers, are not suitable for use in source-follower applications or other circuit arrangements where both the source and drain are at a high potential with respect to the substrate. For such applications, these devices would require a substantially thicker epitaxial surface layer, thus negating a principal advantage of the RESURF technique and increasing device size and cost, or they would require a lower epitaxial doping level, which would increase on-resistance, again negating a principal advantage of the RESURF technique.

SUMMARY OF THE INVENTION

It is therefore an object of the present invention to provide a lateral double-diffused MOS transistor which is suitable for use in source-follower applications or other circuit arrangements where both the source and drain are at a high potential with respect to the substrate.

It is a further object of the invention to provide a lateral double-diffused MOS transistor suitable for source-follower applications while maintaining the advantages of devices constructed using the RESURF technique.

In accordance with the invention, these objectives are achieved by a lateral double-diffused MOS transistor of the type described above, in which the single prior-art surface layer on the semiconductor substrate is replaced by a 3-layer configuration including a first semiconductor layer of the second conductivity type on the substrate, a second semiconductor layer of the first conductivity type on the first layer, and a third semiconductor surface layer of the second conductivity type on the second layer. This 3-layer configuration permits operation in the source-follower mode by preventing device breakdown when both the source and drain are operated at relatively high voltages with respect to the substrate.

In a further embodiment of the invention, a plurality of spaced-apart semiconductor zones of the second conductivity type are located within that portion of the second semiconductor layer extending from adjacent the channel region to beneath the drain contact region. These semiconductor zones may either be strip-shaped zones which extend continuously from adjacent the channel region to beneath the drain contact region or else each zone may include first and second subzones, with the first subzone located adjacent to the channel region and the second subzone spaced apart from the first subzone and located beneath the drain contact region of the device. These semiconductor zones serve to prevent the first semiconductor layer from floating by connecting it to the third semiconductor surface layer of the device, and also provide an additional RE- SURF effect in the lateral direction, thus improving both breakdown voltage and device conductivity.

In another embodiment of the invention, device conductivity can be further improved by providing a second drain region and a further gate electrode, so that the second semiconductor layer can also contribute to device conductivity when the transistor is in the "on" state.

BRIEF DESCRIPTION OF THE DRAWING

FIG. 1 is a vertical cross-sectional view of a lateral double-diffused MOS transistor in accordance with a first embodiment of the invention;

FIG. 2A is a plan view along the section line II—II of the transistor of FIG. 1;

FIG. 2B is a plan view of a lateral double-diffused MOS transistor in accordance with a second embodiment of the invention;

FIG. 2C is a plan view of a lateral double-diffused MOS transistor in accordance with a third embodiment of the invention; and FIG. 3 is a vertical cross-sectional view of a lateral double-diffused MOS transistor in accordance with a fourth embodiment of the invention.

DETAILED DESCRIPTION

As noted above, conventional lateral double-diffused MOS transistors are not suitable for efficient use in source-follower circuits, because of the relatively thick epitaxial layers required to avoid punchthrough breakdown in the source-follower mode. This results in an unduly large and expensive-to-manufacture device. Furthermore, prior-art RESURF techniques, which permit the use of thinner epitaxial layers, result in devices which are unsuited for source-follower applications because of similar high-voltage breakdown problems. More specifically, in typical source-follower applications, the device substrate is normally grounded, while the drain, source and channel regions of the device experience high voltage levels in the "on" state when these devices are operated with high power supply voltages. Under such condition, conventional RESURF devices are subject to punchthrough breakdown (from channel to substrate) which precludes operation in the source-follower mode.

These prior-art problems are overcome in the present invention by a device such as that shown in FIG. 1, employing a triple-layer structure above the substrate. It should be noted that FIG. 1, as well as the remaining figures of the drawing, are not drawn to scale, and in particular the vertical dimensions are exaggerated for improved clarity. Additionally, like parts are designated with like reference numerals in the various figures, and semiconductor regions of the same conductivity type are shown hatched in the same direction.

In FIG. 1, a lateral double-diffused MOS transistor 10 has a semiconductor substrate 12 of a first conductivity type, here p-type, on which the device is constructed. A first semiconductor layer 14 of a second conductivity type opposite to that of the first, here n-type, is located on a first major surface 12a of the substrate, while a second semiconductor layer 16 of the first conductivity type is located on the first semiconductor layer. The basic layered construction of the device is completed by a third semiconductor surface layer 18 of the second conductivity type which is located on the second layer.

The lateral double-diffused MOS transistor of the invention is constructed within this layered structure by providing a first surface-adjoining channel region 20 of p-type material in the third layer, with a surface-adjoining source region 22 of n-type material in a portion of p-type region 20. A first surface-adjoining drain contact region 24 of n-type material is provided in the third layer 18 and is spaced apart from the first channel region, and a portion of the third semiconductor surface layer 18 between the drain contact region 24 and the first channel region 20 forms an extended drain region 24a. Similarly, that portion of the second layer extending from the channel region 20 to beneath the first drain contact region 24 forms an extended channel region.

An insulating layer 26 is provided on the surface of the transistor, over the third surface layer, and covers at least the portion of the first channel region 20 which is located between the source and the first drain regions. A first gate electrode 30 is provided on the insulating layer 26, over the previously-mentioned portion of the first channel region, and is electrically isolated from the third layer by the insulating layer 26. An electrical connection to the first drain contact region 24 is provided by a first drain electrode 32, while a source electrode 28 is provided to contact the source region 22, and this source electrode also serves to connect the first channel region 20 to the source region 22. The basic construction of the device is completed by a substrate electrode 34 on lower major surface 12b of the substrate 12.

The principal difference between the present invention and prior-art lateral double-diffused MOS transistors, such as FIG. 1 of my U.S. Pat. No. 4,300,150, lies in the presence of the second semiconductor layer 16, which in FIG. 1 forms a p-type extension of the channel region 20 between the n-type first and third semiconductor layers, and which extends from the channel region 20 to beneath the drain region 24, 24a. This configuration is in contrast to the prior art device shown in FIG. 1 of my prior patent, in which the area between the channel and drain is composed of a single n-type layer 12.

The three-layer configuration of my present invention affords several important design advantages, which permit the use of devices incorporating the present invention in source-follower circuits. In particular, by providing an extended channel in the form of second semiconductor layer 16, it is possible to increase the doping levels of the n-type first and third semiconductor layers to substantially avoid the channel-to-substrate punchthrough breakdown problem previously described. Ordinarily, such an increased doping level would be undesirable because it would reduce the drain-to-channel avalanche breakdown voltage of the device, but here, by adding the p-type second semiconductor layer, this undesirable decrease in avalanche breakdown voltage is substantially avoided. By redistributing the electrical field over a greater area of the device, the p-type second semiconductor layer utilizes the basic RESURF principle to reduce the localized magnitude of the electrical field adjacent the channel, and thus prevents avalanche breakdown in this region when higher doping levels are used in the third, and particularly the first, semiconductor layers in order to prevent punchthrough during operation in the source-follower mode. Thus, the present invention results in a device which is particularly suitable for high-voltage operation in the source-follower mode due to its improved punchthrough and avalanche breakdown characteristics.

Furthermore, in accordance with basic RESURF principles, the three semiconductor layers are not only more highly-doped than in conventional devices, but are also substantially thinner, thus resulting in a smaller, less expensive and easier-to-manufacture device. Thus, while the total thickness of all three semiconductor layers (i.e. the total thickness between insulating layer 26 and the upper surface 12a of the substrate) may typically be about 6 microns in the present invention for a device capable of operating at 400 volts, the prior-art MOS structure of Pocha et al, described above, requires an epitaxial layer thickness of greater than 23 microns in order to achieve a punchthrough breakdown voltage of only 200 volts. In addition, the relatively high doping levels of the semiconductor layers in the present invention provide improved normalized "on" resistance despite the use of relatively thin semiconductor layers. Thus, the present invention serves to improve both breakdown voltage and normalized "on" resistance, thereby permitting effective and efficient operation in the source-follower mode.

While the configuration of the present invention can be advantageously used in various device constructions, the following table of approximate values will illustrate the configuration of a typical device having a breakdown voltage of about 400 volts:

| REGION (Ref. No.) | TYPE | TYPICAL DOPING | TYPICAL THICKNESS |
|---|---|---|---|
| First semiconductor layer (14) | n+ | $10^{16}$ donors/cm$^3$ | 2 microns |
| Second semiconductor layer (16) | p+ | $10^{16}$ acceptors/cm$^3$ | 2 microns |
| Third semiconductor layer (18) | n+ | $10^{16}$ donors/cm$^3$ | 2 microns |
| Source (22) | n++ | $10^{18}$–$10^{20}$ donors/cm$^3$ | 2 microns |
| Drain Contact (24) | n++ | $10^{18}$–$10^{20}$ donors/cm$^3$ | 2 microns |
| Channel (20) | p++ | $10^{17}$–$10^{20}$ acceptors/cm$^3$ | 4 microns |
| Substrate (12) | p− | $10^{14}$–$10^{15}$ acceptors/cm$^3$ | — |

As can be seen from the above table, the product of doping concentration and layer thickness for the first, second and third layers is typically about $2(10)^{12}$ atoms/cm$^2$, in accordance with the RESURF principle.

A plan view of the device of FIG. 1 along the section line II—II is shown in FIG. 2A. This plan view shows a horizontal section of the p-type second semiconductor layer 16, as well as a portion of the more highly-doped channel region 20 which extends into the second semiconductor layer beneath the source. Due to the substantially continuous nature of this intermediate p-type layer between the upper (third) and lower (first) semiconductor layers, the lower n-type semiconductor layer does not conduct a portion of the total device current in the "on" state because layer 14 is isolated from the current-carrying path due to the intervening second semiconductor layer 16. However, substantial further reduction in normalized "on" resistance could be attained if the first semiconductor layer 16 of FIG. 2A were to be used as an additional current path. Two alternate embodiments for accomplishing this function are shown in FIGS. 2B and 2C.

In these embodiments, a plurality of spaced-apart semiconductor zones 16c, 16d of the second conductivity type (here n-type) are located within that portion of the second semiconductor layer 16 extending from adjacent the channel region 20 to beneath the drain contact region 24. In FIG. 2B, these semiconductor zones are formed from strip-shaped zones 16c which extend continuously from adjacent the channel region to beneath the drain contact region, while in FIG. 2C, each spaced-apart semiconductor zone is formed from a first sub-zone 16d located adjacent the channel region and a second sub-zone 16d' which is spaced apart from the first sub-zone and is located beneath the drain contact region. These spaced-apart semiconductor zones 16c, 16d and 16d' are n-type zones having a typical doping level of about $10^{16}$ donors/cm$^3$. In FIG. 2B, the lateral extent of the semiconductor zones 16c is shown by reference numerals 16a and 16b to denote the left and right edges, respectively, of the zones. In FIG. 1, dotted lines are used to show where these left and right edges would appear in a cross-section along the line I—I of FIG. 2B if these semiconductor zones were to be incorporated into the device of FIG. 1. As shown in FIG. 1, the semiconductor zones extend in the vertical direction from the third semiconductor layer 18 down to the first semiconductor layer 14.

By means of these semiconductor zones, a connection is formed between the upper (third) and lower (first) semiconductor layers, so that the first semiconductor layer is no longer floating, and can contribute to device conductivity in the "on" state, thus lowering normalized "on" resistance. In fact, normalized "on" resistance will be reduced by a factor of about 2 by including these semiconductor zones in the embodiment of FIG. 1. Additionally, by preventing the lower (first) semiconductor layer from floating by connecting it to the uppermost (third) semiconductor layer, an additional advantage is obtained in that the avalanche breakdown voltage of the device will be increased. Furthermore, with these zones, the critical nature of the upper (third) semiconductor layer decreases, so that it can be made thinner.

An additional embodiment of the invention, in which device conductivity is further improved, is shown in FIG. 3. This device differs from the device shown in FIG. 1 basically in that the single gate and drain structure of FIG. 1 is replaced by a modified dual-gate/dual-drain structure. More particularly, lateral double-diffused MOS transistor 11 includes a second surface-adjoining drain end region 40 of p-type material, as well as a second surface-adjoining channel region 36 of n-type material which is controlled by a further gate electrode 46 (G2) located over the second channel region. The embodiment of FIG. 3 also differs from the previously-described embodiment of FIG. 1 in that the original drain contact region 24 (hereinafter referred to as the first drain contact region for clarity) now includes a p-type surface region 38 within the n-type region 36, so that region 36 now also serves as a second surface-adjoining channel region for the new portion (on its right side), while the p-type zone 38 serves as a further surface-adjoining source region for the new portion of the device. A first drain electrode 44 contacts both source region 38 and region 36, and now serves as both a drain electrode (D1) for the original portion of the device and as a source electrode (S2) for the new portion. The purpose of this more complex dual-gate/dual-drain structure is to enhance device conductivity in the "on" state by enabling the second p-type semiconductor layer 16 to also contribute to device conductivity by conducting holes from region 38, through the second channel region 36, the second drain end region 40 and the second semiconductor layer 16 back to source region 22. Electrode 28, which contacts both regions 20 and 22, now serves as both a source electrode (S1) for the original portion of the device and as a drain electrode (D2) for the new portion.

Yet a further improvement in normalized "on" resistance may be achieved by combining the dual-gate/dual-drain structure of FIG. 3 with the spaced-apart semiconductor zones 16c or 16d/d' of FIG. 2B or 2C. In this manner all three semiconductor layers will contribute to device conductivity, thus achieving optimum normalized "on" resistance.

Thus, by using a unique triple-layer construction, the present invention provides a lateral double-diffused MOS transistor which is capable of operating at high voltages in the source-follower mode, while at the same time providing a low normalized "on" resistance in a vertically compact and easily manufactured structure.

Finally, while the invention has been particularly shown and described with reference to certain preferred embodiments thereof, it will be understood by those skilled in the art that various changes in form and detail may be made without departing from the spirit and scope of the invention.

I claim:

1. A lateral double-diffused MOS transistor, which comprises:
   a semiconductor substrate of a first conductivity type;
   a first semiconductor layer of a second conductivity type opposite to that of the first on a first major surface of said substrate;
   a second semiconductor layer of said first conductivity type on said first layer;
   a third semiconductor surface layer of said second conductivity type on said second layer, the product of the net doping concentration and the thickness of said first, second and third semiconductor layers each being selected to accordance with the RESURF principle such that the product of doping concentration and layer thickness is typically approximately $10^{12}$ atoms/cm$^2$;
   a first surface-adjoining channel region of said first conductivity type in said third layer and connected to said second semiconductor layer;
   a surface-adjoining source region of said second conductivity type in said channel region;
   a first surface-adjoining drain contact region of said second conductivity type in said third layer and spaced apart from said first channel region;
   an extended drain region formed from a portion of said third layer between said first drain contact region and said first channel region;
   an insulating layer on the surface of said transistor and covering at least that portion of the first surface-adjoining channel region located between said source and said extended drain regions;
   a first gate electrode on said insulating layer, over said portion of the first channel region and electrically isolated from said third layer; and
   source and first drain electrodes connected respectively to the source and first drain contact regions of the transistor.

2. A lateral double-diffused MOS transistor as in claim 1, wherein the doping level of said second layer is higher than that of said substrate, the doping level of said first channel region is higher than that of said second layer, and the doping level of said source and first drain contact regions is higher than the doping level of said first and third layers.

3. A lateral double-diffused MOS transistor as in claim 2, wherein said source electrode electrically connects said source and first channel regions together, and further comprising a substrate electrode on a second major surface of said substrate opposite said first major surface.

4. A lateral double-diffused MOS transistor as in claim 1, further comprising a plurality of spaced-apart semiconductor zones of said second conductivity type located in that portion of said second semiconductor layer extending laterally from adjacent said first channel region to beneath said first drain contact region, said semiconductor zones extending vertically from said first semiconductor layer to said third semiconductor layer.

5. A lateral double-diffused MOS transistor as claimed in claim 4, wherein said spaced-apart zones comprise strip-shaped zones extending continuously from adjacent said first channel region to beneath said first drain contact region.

6. A lateral double-diffused MOS transistor as claimed in claim 4, wherein each of said spaced-apart zones comprises a first subzone located adjacent said first channel region and a second subzone, spaced apart from said first subzone and located beneath said first drain contact region.

7. A lateral double-diffused MOS transistor as claimed in claim 4, wherein said spaced-apart semiconductor zones comprise n-type zones having a doping level of about $10^{16}$ donors/cm$^3$.

8. A lateral double-diffused MOS transistor as in claim 1, further comprising a second surface-adjoining drain end region of said first conductivity type in said third layer, extending down to said first layer, and electrically isolated from said first drain contact region by a p-n junction, a second surface-adjoining channel region of said second conductivity type between said first drain contact region and said second drain end region, said insulating layer on the surface of said transistor further covering that portion of the second surface-adjoining channel region located between said drain regions, a further surface-adjoining source region of said first conductivity type in said second surface-adjoining channel region and connected to said first drain electrode, and a further gate electrode on said insulating layer, over said portion of the second channel region and electrically isolated from said third layer.

9. A lateral double-diffused MOS transistor as in claim 8, further comprising a plurality of spaced-apart semiconductor zones of said second conductivity type located in that portion of said second semiconductor layer extending laterally from adjacent said first channel region to at least beneath said first drain contact region, said semiconductor zones extending vertically from said first semiconductor layer to said third semiconductor layer.

10. A lateral double-diffused MOS transistor as claimed in claim 9, wherein said spaced-apart zones comprise strip-shaped zones extending continuously from adjacent said first channel region to at least beneath said first drain contact region.

11. A lateral double-diffused MOS transistor as claimed in claim 9, wherein each of said spaced-apart zones comprises a first subzone located adjacent said first channel region and a second subzone, spaced apart from said first subzone and located beneath said first drain contact region.

12. A lateral double-diffused MOS transistor as in claim 1, wherein said first and third semiconductor layers comprise n-type layers having a doping level of about $10^{16}$ donors/cm$^3$. and a thickness of about 2 microns, and said second semiconductor layer comprises a p-type layer having a doping level of about $10^{16}$ acceptors/cm$^3$ and a thickness of about 2 microns.

* * * * *